(12) United States Patent
Murayama et al.

(10) Patent No.: US 7,948,092 B2
(45) Date of Patent: May 24, 2011

(54) ELECTRONIC COMPONENT AND METHOD FOR MANUFACTURING THE SAME

(75) Inventors: Kei Murayama, Nagano (JP); Yuichi Taguchi, Nagano (JP); Akinori Shiraishi, Nagano (JP); Masahiro Sunohara, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 415 days.

(21) Appl. No.: 11/943,203

(22) Filed: Nov. 20, 2007

(65) Prior Publication Data

US 2008/0116566 A1 May 22, 2008

(30) Foreign Application Priority Data

Nov. 22, 2006 (JP) ................................. 2006-316201

(51) Int. Cl.
*H01L 21/00* (2006.01)
(52) U.S. Cl. .......................... 257/783; 257/777; 257/686
(58) Field of Classification Search .................. 257/777, 257/783, 686, 700
See application file for complete search history.

(56) References Cited

U.S. PATENT DOCUMENTS

| 5,324,980 | A | * | 6/1994 | Kusunoki | 257/74 |
| 5,355,022 | A | * | 10/1994 | Sugahara et al. | 257/768 |
| 5,455,445 | A | * | 10/1995 | Kurtz et al. | 257/419 |
| 6,352,921 | B1 | | 3/2002 | Han et al. | |
| 6,355,501 | B1 | * | 3/2002 | Fung et al. | 438/107 |
| 6,538,333 | B2 | * | 3/2003 | Kong | 257/777 |
| 6,642,081 | B1 | * | 11/2003 | Patti | 438/109 |
| 2006/0216856 | A1 | | 9/2006 | Zhao | |

FOREIGN PATENT DOCUMENTS

| EP | 1 261 021 | 11/2002 |
| JP | 2000-039371 | 2/2000 |
| WO | 2008/035261 | 3/2008 |

* cited by examiner

*Primary Examiner* — Leonardo Andújar
(74) *Attorney, Agent, or Firm* — Rankin, Hill & Clark LLP

(57) ABSTRACT

A method of manufacturing an electronic component includes the steps of: a) forming via holes penetrating through a first semiconductor substrate and a second semiconductor substrate which are bonded together by way of a connection layer; b) pattern-etching the second semiconductor substrate using the connection layer as an etch-stop layer to form trenches communicated with the via holes; and c) integrally forming first via plugs buried in the via holes and pattern wirings buried in the trenches through plating.

13 Claims, 9 Drawing Sheets

ELECTRONIC COMPONENT AND METHOD FOR MANUFACTURING THE SAME

This application is based on and claims priority from Japanese Patent Application No. 2006-316201, filed on Nov. 22, 2006, the entire contents of which are hereby incorporated by reference.

BACKGROUND OF THE INVENTION

1. Technical Field

The present disclosure relates to an electronic component formed from a semiconductor substrate and a method for manufacturing the same.

2. Background Art

A semiconductor element such as silicon may be used for; for example, a substrate (interposer) used for mounting electronic elements such as semiconductor elements in lieu of a ceramic material or a resin material. An interposer—which is made of e.g., silicon and used for mounting electronic elements—exhibits superior thermal conductivity than those exhibited by the ceramic material or the resin material. For this reason, when an electronic element to be mounted generates heat, such an interposer has the advantage of exhibiting superior heat radiation.

Further, a substrate formed from a semiconductor material is more easily precision-fabricated than the ceramic material or the resin material, and has an advantage in microfabrication. For these reasons, an interposer formed from a semiconductor material such as silicon may be adopted for an especially-microfabricated electronic component. (See e.g., Japanese Unexamined Patent Document: JP-A-2000-39371)

However, when an electronic component is formed by use of an interposer formed from a semiconductor substrate, it is difficult to form wirings for mounting an element in such a manner that they are buried in the substrate, in light of fabrication. For instance, when wirings used for mounting an element are formed on the semiconductor substrate, the substrate gets rough. When such roughness is formed on the substrate, the reliability of connection of an electronic component may be degraded, and there also arises a problem of difficulty being encountered in thinning or downsizing the electronic component.

SUMMARY OF THE INVENTION

Accordingly, exemplary embodiments provide a novel and useful electronic component which solves the above-described problems and a method for manufacturing the same.

Also, exemplary embodiments provide a thinned and reliable electronic component which is formed from a semiconductor substrate.

According to the first aspect of the present invention, a method of manufacturing an electronic component comprises the steps of:

a) forming via holes penetrating through a first semiconductor substrate and a second semiconductor substrate which are bonded together by way of a connection layer;

b) pattern-etching the second semiconductor substrate using the connection layer as an etch-stop layer to form trenches communicated with the via holes; and c) integrally forming first via plugs buried in the via holes and pattern wirings buried in the trenches through plating.

According to the second aspect of the present invention, an electronic component comprises:

a first semiconductor substrate;

a second semiconductor substrate bonded to the first semiconductor substrate;

a connection layer provided between the first semiconductor substrate and the second semiconductor substrate;

first via plugs penetrating through the first semiconductor substrate; and pattern wirings which penetrate through the second semiconductor substrate and are formed integrally with the via plugs, at least a portion of the patter wirings substantially reaching the connection layer.

According to the present invention, it is possible to provide a thinned and highly-reliable electronic component that is formed from a semiconductor substrate.

DETAILED DESCRIPTION OF EXEMPLARY EMBODIMENTS

A method of manufacturing an electronic component comprises the steps of:

a) forming via holes penetrating through a first semiconductor substrate and a second semiconductor substrate which are bonded together by way of a connection layer;

b) pattern-etching the second semiconductor substrate using the connection layer as an etch-stop layer to form trenches communicated with the via holes; and c) integrally forming first via plugs buried in the via holes and pattern wirings buried in the trenches through plating.

Namely, the manufacturing method is characterized in that the connection layer used for bonding two semiconductor substrates (e.g., silicon substrates) is used as an etch-stop layer for use in forming the trenches in which the pattern wiring is formed.

Therefore, it is possible to readily form the trenches for use in forming the pattern wiring. According to the above-described manufacturing method, the pattern wiring formed in the trenches can be readily formed so as not to run over a surface of the second semiconductor substrate. For instance, the pattern wiring is formed in such a way that the surface of pattern wiring becomes substantially flush with the surface of the second semiconductor substrate or becomes recessed with respect to the surface of the second semiconductor substrate.

Namely, the pattern wiring has a structure of being substantially housed in the second semiconductor substrate, and slimming-down and miniaturization of the electronic component and enhancement of reliability of the pattern wiring become practicable.

A specific example of the method for manufacturing an electronic device will now be described with reference to the drawings.

First Exemplary Embodiment

FIGS. 1A through 1D show, in sequence of procedures, the method for manufacturing an electronic component of a first exemplary embodiment. Further, the steps shown in FIGS. 1E to 1G may also be performed subsequently to the steps shown in FIGS. 1A through 1D.

Figure 1A:
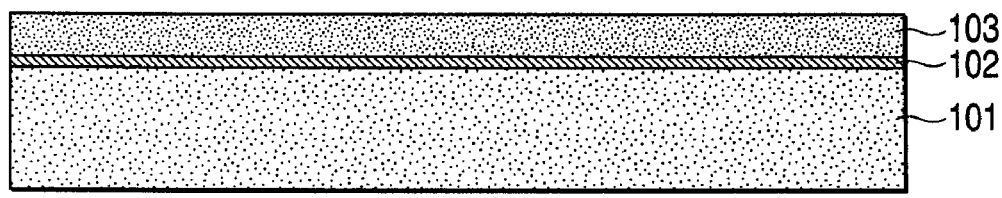
FIG. 1A is a view showing a method for manufacturing an electronic component of a first exemplary embodiment (part 1)

First, in a step shown in FIG. 1A, a first semiconductor substrate (a silicon substrate) made of, e.g., silicon, and a second semiconductor substrate (a silicon substrate) 103 made of silicon are subjected to pressurization and heating through a connection layer 102 made of, e.g., a silicon oxide film, to thus become bonded together. It is preferable to form the connection layer 102 on the first semiconductor substrate 101 or the second semiconductor substrate 103 prior to bonding together. Although the connection layer 102 can be formed by means of, e.g., thermal oxidation of silicon, or the like, a technique of forming the connection layer 102 is not limited to thermal oxidation, and the connection layer may also be formed by means of various techniques such as plasma CVD, sputter, and the like.

Figure 1B:
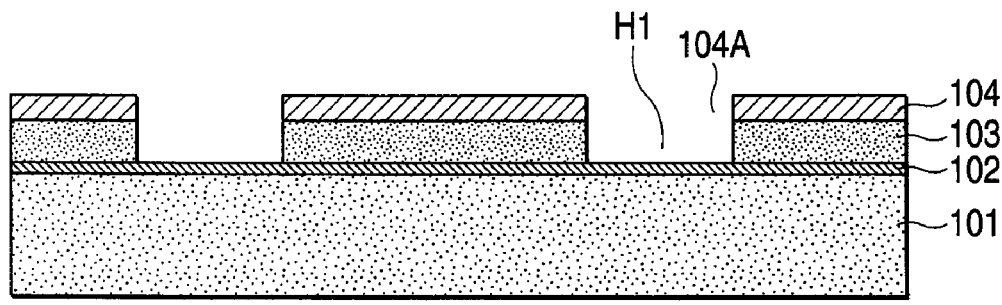
FIG. 1B is a view showing the method for manufacturing an electronic component of the first exemplary embodiment (part 2)

In a step shown in FIG. 1B, a mask pattern 104 having an opening 104A is formed on the second semiconductor substrate 103. The mask pattern 104 can be formed by patterning resist layer—which is formed by bonding, e.g., a film-like resist (a dry film resist) or by coating liquid resist—through development and exposure by means of photolithography.

Next, the second semiconductor substrate 103 is subjected to pattern etching (RIE: Reactive Ion Etching) using the mask pattern 104 as a mask. In this case, there are formed via holes H1 which penetrate through the second semiconductor substrate 103 to thus reach the connection layer 102. Under conditions (a gas, plasma excitation power, pressure, and the like) for etching silicon forming the second semiconductor substrate 103, a etching rate of the connection layer 102 formed from a silicon oxide film usually becomes considerably smaller in normal times. Therefore, when etching has reached the connection layer 102; namely, when a hole has penetrated through the second semiconductor substrate 103, etching is substantially suspended.

Figure 1C:
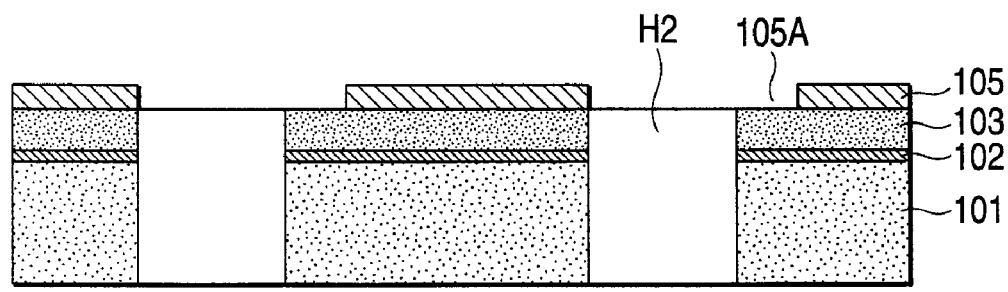
FIG. 1C is a view showing the method for manufacturing an electronic component of the first exemplary embodiment (part 3)

In a step shown in FIG. 1C, exposed areas of the connection layer 102 at the bottoms of the respective via holes H1 are removed by etching under conditions (a gas, plasma excitation power, pressure, and the like) complying with the composition of the connection layer 102 (e.g., a silicon oxide film). Subsequently, the conditions of etching (a gas, plasma excitation power, pressure, and the like) are made compliant with those of silicon, and then the first semiconductor substrate 101 is subjected to pattern etching (RIE). Thus, via holes H2 penetrating through the first semiconductor substrate 101, the connection layer 102, and the second semiconductor substrate 103 are formed.

Next, after removing the mask pattern 104, a mask pattern 105 having opening sections 105A is formed on the second semiconductor substrate 103. The mask pattern 105 can be formed by patterning a resist film—which is formed by bonding, e.g., a film-like resist (a dry film resist) or by coating a liquid resist—through development and exposure by means of photolithography. The profile (pattern) of each of the opening sections 105A corresponds to the shape of pattern wiring (trenches) formed in a subsequent step.

Figure 1D:
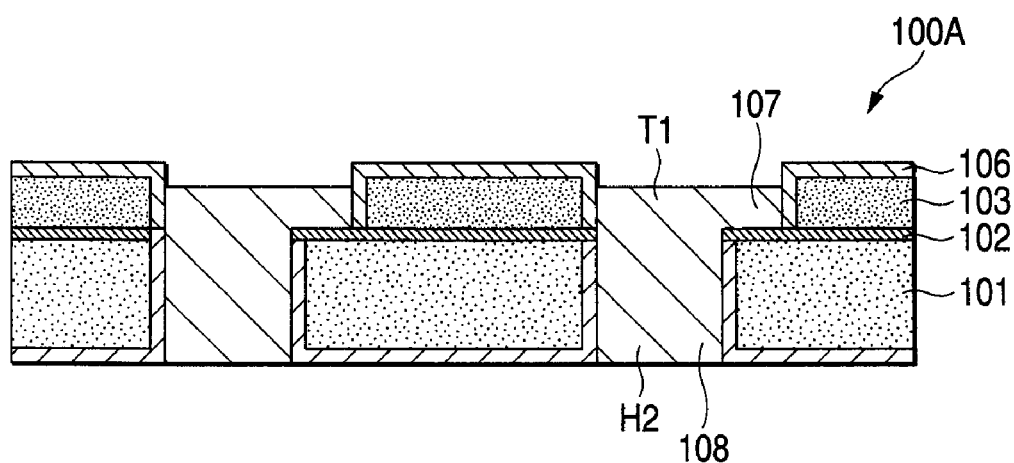
FIG. 1D is a view showing the method for manufacturing an electronic component of the first exemplary embodiment (part 4)

Next, in a step shown in FIG. 1D, the second semiconductor substrate 103 is subjected to pattern etching (RIE) using the mask pattern 105 as a mask. Consequently, there are formed trenches T1 which are communicated with the via holes H2 and penetrate the second semiconductor substrate 103 to thus reach the connection layer 102.

As described above, under the conditions for etching silicon constituting the second semiconductor substrate 103, an etching rate of the connection layer 102 formed from a silicon oxide film usually becomes considerably smaller in normal times. Therefore, when etching of the second semiconductor substrate 103 has reached the connection layer 102; namely, when a hole has penetrated through the second semiconductor substrate 103, etching is substantially suspended. In other words, the connection layer 102 serves as an etch-stop layer for use in forming the trenches T1.

Next, an insulation film 106 made of; e.g., a silicon oxide film, is formed over the surface of the first semiconductor substrate 101 and the second semiconductor substrate 103 including interior wall surfaces of the via holes H2 and interior wall surfaces of the trenches T1.

Next, via plugs 108 filling the via holes H and pattern wiring 107 filling the trenches T1 are formed integrally by plating of Cu. The via plugs 108 and the pattern wiring 107 are formed as follows. First, a seed layer (a feeding layer) is formed on the insulation film 106 by means of electroless plating, and a mask pattern is formed on the seed layer. Then, the via plugs 108 and the pattern wiring 107 are formed by means of electrolytic plating. Further, the mask pattern and excessive areas of the seed layer which will be uncovered by removing the mask pattern are removed. Thus, an electronic component (a wiring substrate) 100A shown in FIG. 1D can be fabricated.

The electronic device 100A has the via plugs 108 which are made of Cu and penetrate through the first semiconductor substrate 101; and the pattern wiring 107 which is made of Cu and penetrates through the second semiconductor substrate 103, wherein at least a portion of the pattern wiring 107 substantially reaches the connection layer 102.

The above-described method of manufacturing a semiconductor device is characterized in that the connection layer 102 used for bonding two semiconductor substrates (e.g., silicon substrates) 101 and 103 is used as an etch-stop layer for forming the trenches where the pattern wiring 107 is to be formed.

Therefore, it is possible to readily form the trenches T1 used for forming the pattern wiring 107. Further, according to the manufacturing method, the pattern wiring 107 provided in the trenches T1 can be readily formed so as not to run over a surface of the second semiconductor substrate 103. For instance, pattern wiring is formed in such a way that the surface of pattern wiring 107 becomes substantially flush with the that of the second semiconductor substrate 103 or becomes recessed with respect to the surface of the second semiconductor substrate 103.

Namely, the pattern wiring 107 has a structure of being substantially housed in the second semiconductor substrate 103, and thus it is possible to thin and downsize the electronic component 100A and enhance the reliability of pattern wiring 107.

For instance, when the first semiconductor substrate 101 and the second semiconductor substrate 103 are silicon substrates, a silicon oxide film (SiO2) or a film (SiON, SiCO, SiCON, or the like) formed by addition of nitrogen or carbon into a silicon nitride film (SiN) or a silicon oxide film may be used as the connection layer 102. In this case, the connection layer 102 can be used as an etch-stop layer by virtue of a difference (an etching selectivity) between an etching-amount of the substrate (silicon) and an etching-amount of the connection layer (a silicon oxide film, and the like) by means of pattern etching. Thus, it is possible to readily form the trenches T1 and the pattern wiring 107.

As mentioned above, a substrate formed by bonding two semiconductor substrates (wafers) may be called a silicon-on-insulator (SOI) substrate or an SOI wafer.

Subsequently to the step shown in FIG. 1D, steps as described below may also be performed, to thus form a structure appropriate for mounting an electronic element (e.g., a semiconductor element) or to form an electronic component mounted with an electronic element.

Figure 1E:
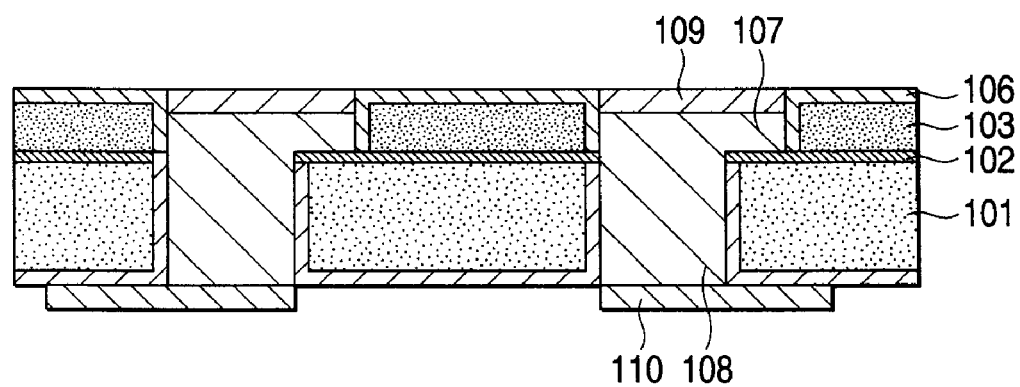
FIG. 1E is a view showing the method for manufacturing an electronic component of the first exemplary embodiment (part 5)

For instance, in a step shown in FIG. 1E, metal layers 109 and 110 made of Ni/Au (a multilayer structure including an Au layer and an Ni layer, wherein the Au layer is formed on an exterior side) are formed on the pattern wiring 107 and the via plugs 108. In this case, the metal layer 109 formed on the pattern wiring 107 is preferably formed so as not to run over the trenches; for instance, in such a way that the surface of the metal layer 109 becomes flush with the surface of the second semiconductor substrate 103.

Figure 1F:
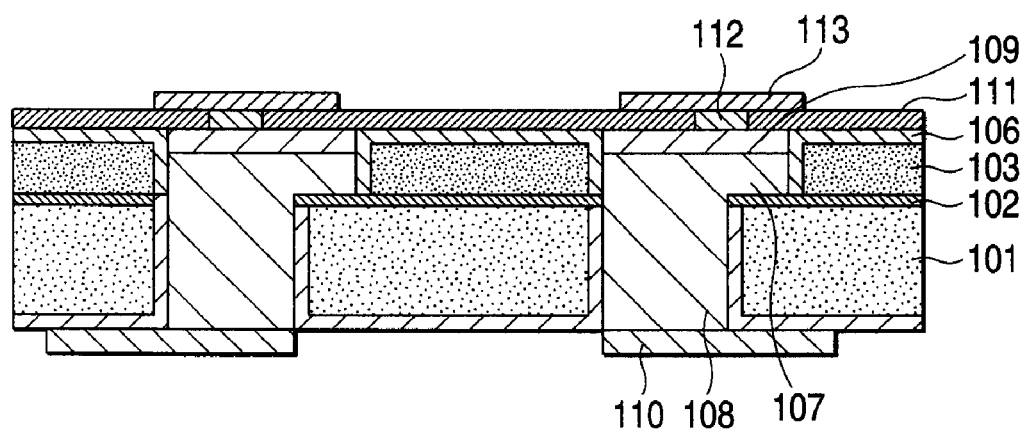
FIG. 1F is a view showing the method for manufacturing an electronic component of the first exemplary embodiment (part 6)

In a step shown in FIG. 1F, the insulation layer 111 is formed over the second semiconductor substrate 103 so as to cover the metal layer 109. Moreover, via holes penetrating through the insulation layer 111 are formed, and there are formed via plugs 112—which are buried in the via holes and are connected to the metal layer 109—and pattern wiring (electrode pads) 113 to be connected to the via plugs 112. In this case, the pattern wiring 113 is formed over the pattern wiring 107 (the metal layer 109) with the insulation layer 111 sandwiched therebetween. Namely, there are formed multi-layer wirings connected to the electronic element to be mounted in the step.

Figure 1G:
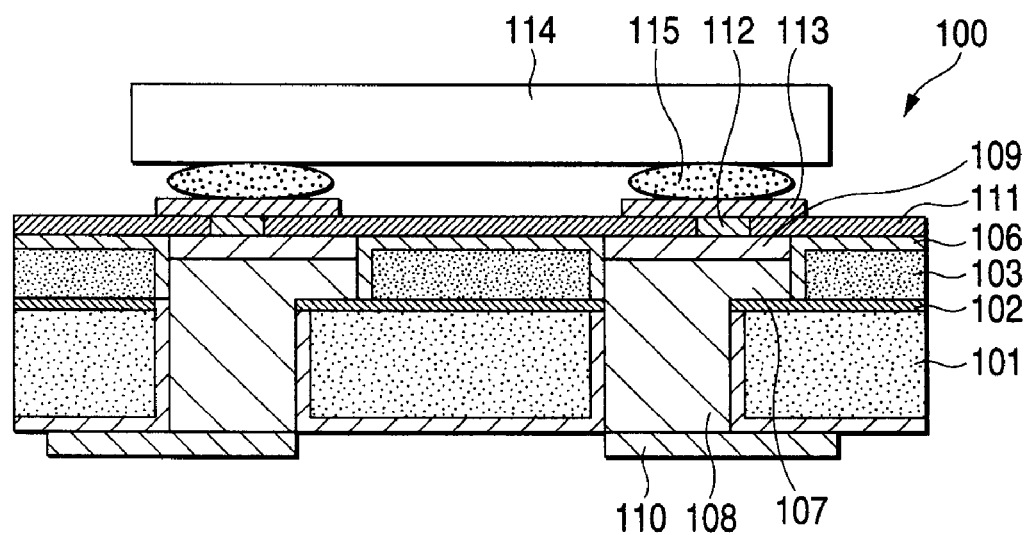
FIG. 1G is a view showing the method for manufacturing an electronic component of the first exemplary embodiment (part 7)

In a step shown in FIG. 1G an electronic element (e.g., a semiconductor element) 114 is connected to the pattern wiring 113 by means of bumps 115. Thus, it is possible to fabricate the electronic component 100 in which the electronic element (the semiconductor element) 114 is mounted on the electronic element (the wiring substrate) 100A shown in FIG. 1D.

In the method of manufacturing an electronic component, an example of portions of specific areas of the first semiconductor substrate 101 and the second semiconductor substrate 103 is described. In usual, a plurality of areas as shown in FIGS. 1A to 1C are formed in a grid pattern in the first semiconductor substrate 101 and the second semiconductor substrate 103. In any of the steps shown in FIGS. 1D to 1G the first semiconductor substrate 101 and the second semiconductor substrate 103 are sliced by means of dicing, to thus be separated into pieces.

Second Exemplary Embodiment

FIGS. 2A to 2I show, in sequence of procedures, the method for manufacturing an electronic component according to a second exemplary embodiment. Further, steps as shown in FIGS. 2J to 2M may also be performed subsequently to the steps shown in FIGS. 2A through 2I.

Figure 2A:
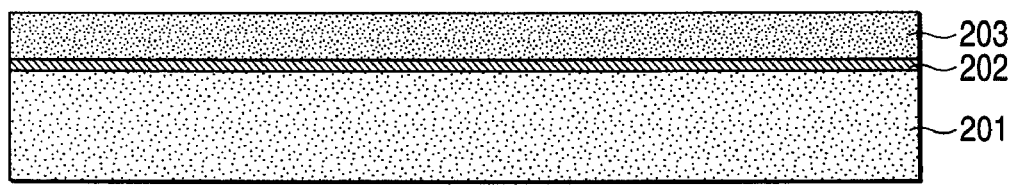
FIG. 2A is a view showing a method for manufacturing an electronic component of a second exemplary embodiment (part 1)

First, in a step shown in FIG. 2A, a first semiconductor substrate 201 and a second semiconductor substrate 203 are subjected to pressurization and heating through a connection layer 202, to thus become bonded together, as the step shown in FIG. 1A. The first semiconductor substrate 201, the second semiconductor substrate 203, and the connection layer 202 of the present embodiment correspond to the first semiconductor substrate 101, the second semiconductor substrate 103, and the connection layer 102 of the first exemplary embodiment, respectively.

Figure 2B:
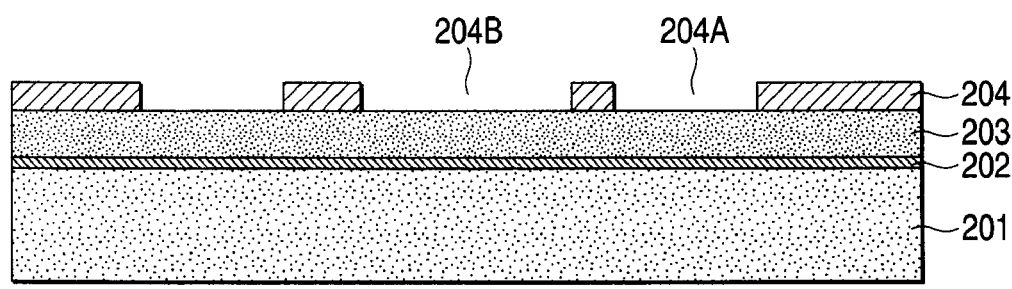
FIG. 2B is a view showing the method for manufacturing an electronic component of the second exemplary embodiment (part 2)
Figure 2C:
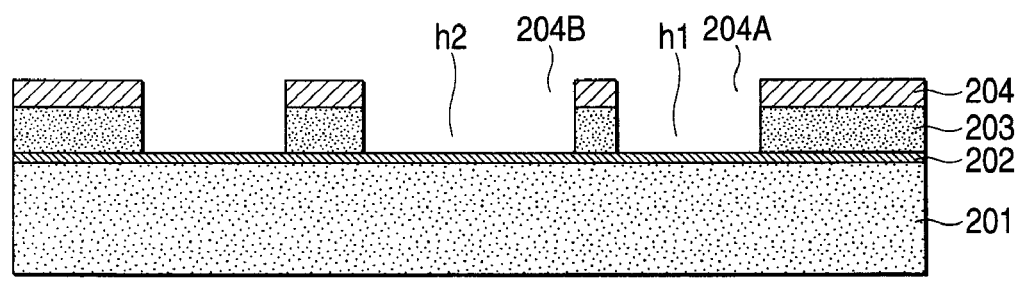
FIG. 2C is a view showing the method for manufacturing an electronic component of the second exemplary embodiment (part 3)

In a step shown in FIG. 2B, a mask pattern 204 having opening sections 204A and 204B is formed on the second semiconductor substrate 203. The mask pattern 204 can be formed by patterning a resist layer—which is formed by bonding, e.g., a film-like resist (a dry film resist) or by coating liquid resist—through development and exposure by means of photolithography.

Next, the second semiconductor substrate 203 is subjected to pattern etching (RIE) using the mask pattern 204 as a mask. In this case, there are formed opening sections h1 and h2 which penetrate through the second semiconductor substrate 203, to thus reach the connection layer 202. The opening sections h1 correspond to via holes (via plugs) formed in a subsequent step, and the opening sections h2 correspond to recesses (cavities), which are used for mounting an electronic element, formed in a subsequent step.

Under conditions for etching silicon constituting the second semiconductor substrate 203, an etching rate of the connection layer 202 made of a silicon oxide film usually becomes considerably smaller. Therefore, when etching has reached the connection layer 202; namely, when a hole has penetrated through the second semiconductor substrate 203, etching is substantially suspended.

Figure 2D:
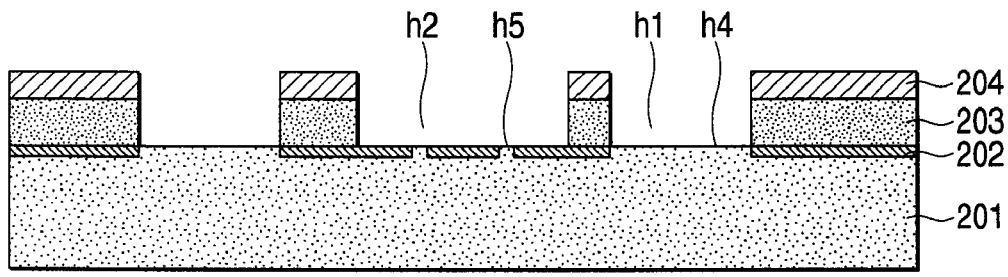
FIG. 2D is a view showing the method for manufacturing an electronic component of the second exemplary embodiment (part 4)

In a step shown in FIG. 2D, exposed areas of the connection layer 202 at the bottoms of the respective opening sections h1 are removed by etching. Consequently, opening sections h4 are formed in the connection layer 202, and then the first semiconductor substrate 201 is exposed. Likewise, some of the exposed areas of the connection layer 202 at the bottom of the respective opening sections h2 are removed in the form of a plurality of circles by means of pattern etching, to thus form opening sections h5. As a result, the first semiconductor substrate 201 becomes exposed through the opening sections h5. The first semiconductor substrate 201 becomes exposed through the opening sections h5. According to pattern-etching of the connection layer 202 in the present step, etching may be performed using a mask pattern formed from a resist. After etching operation, a mask pattern corresponding to the mask pattern 204 (as indicated likewise by reference numeral 204 in the drawings) is again formed after removing the mask pattern.

Figure 2E:
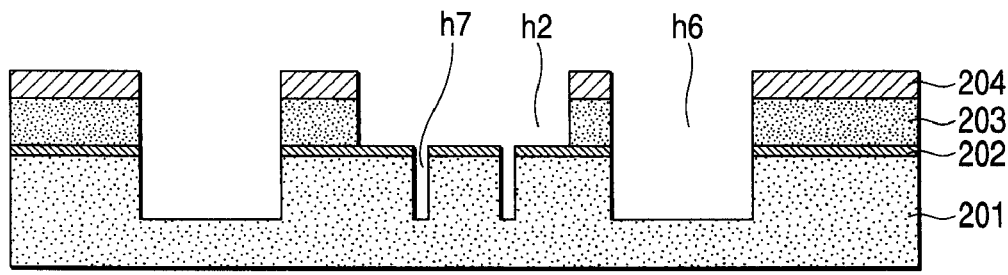
FIG. 2E is a view showing the method for manufacturing an electronic component of the second exemplary embodiment (part 5)

In a step shown in FIG. 2E, the first semiconductor substrate 201 is etched to a predetermined depth by means of pattern etching, using the mask pattern 204 and the connection layer 202 as masks. Then, the opening sections h1 shown in FIG. 2D becomes opening sections h6 which penetrate through the second semiconductor substrate 203 and are formed in the first semiconductor substrate 201 to a predetermined depth. While the opening sections h6 are formed, there are formed opening sections h7 which are communicated with the opening sections h2 and are formed in the first semiconductor substrate 201 to a predetermined depth.

Figure 2F:
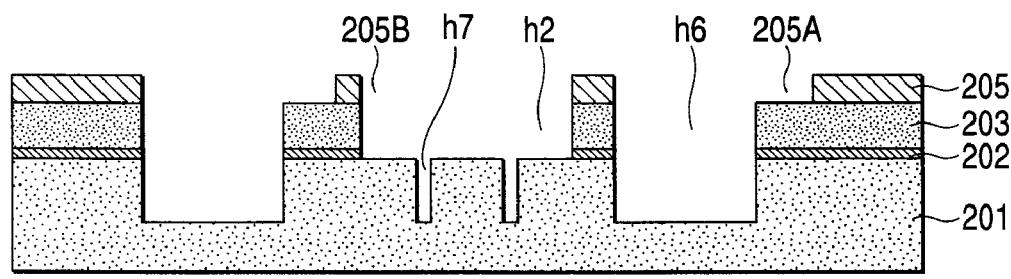
FIG. 2F is a view showing the method for manufacturing an electronic component of the second exemplary embodiment (part 6)
Figure 2G:
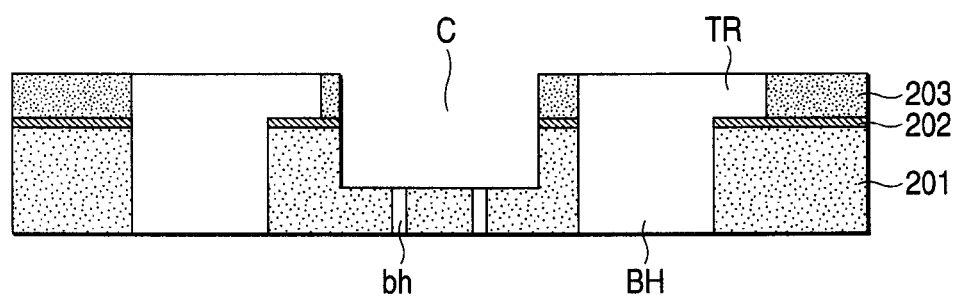
FIG. 2G is a view showing the method for manufacturing an electronic component of the second exemplary embodiment (part 7)

In a step shown in FIG. 2F, the connection layer 202 still remaining in the bottoms of the opening sections h2 are removed by etching. Further, after removing the mask pattern 204, a mask pattern 205 having openings 205A and 205B is newly formed on the second semiconductor substrate 203. In this case, the opening section 205A corresponds to a trench (pattern wiring) formed in a subsequent step, and the opening section 205B corresponds to a recess formed in a subsequent step.

In a step shown in FIG. 2Q the first semiconductor substrate 201 and the second semiconductor substrate 203 are subjected to pattern etching (RIE) using the mask pattern 205 as a mask. Via holes BH penetrating through the first semiconductor substrate 201 and the second semiconductor substrate 203 are formed simultaneously with trenches TR which are communicated with the via holes BH and penetrate through the second semiconductor substrate 203, to thus reach the connection layer 202.

As described above, under the conditions for etching silicon, an etching rate of the connection layer 202 made of a silicon oxide film usually becomes considerably smaller. Therefore, when etching of the second semiconductor substrate 203 has reached the connection layer 202; namely, when a hole has penetrated through the second semiconductor substrate 203, etching is substantially suspended. Namely, the connection layer 202 serves as an etch-stop layer for use in forming the trenches T1.

In the present step, the opening sections h2 shown in FIG. 2F change into recesses (cavities) C which penetrate through the second semiconductor substrate 203 and are formed in the first semiconductor substrate 201 to a predetermined depth. Concurrently with formation of the recesses C, there are formed via holes bh penetrating through areas of the first semiconductor substrate 201 located in the bottoms of the respective recesses C.

Figure 2H:
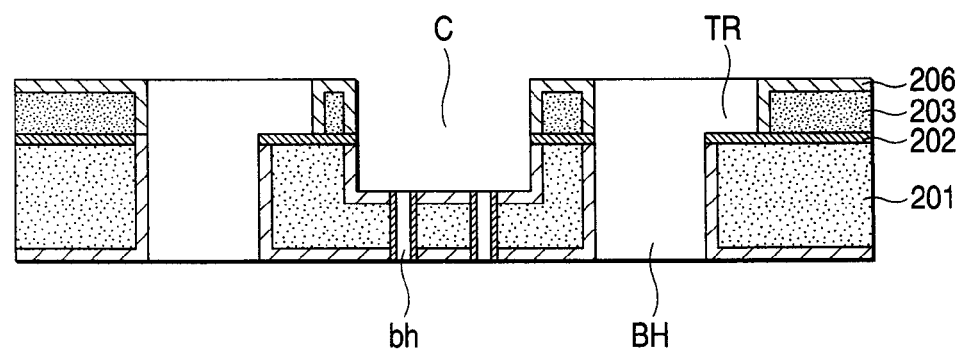
FIG. 2H is a view showing the method for manufacturing an electronic component of the second exemplary embodiment (part 8)

In a step shown in FIG. 2H, an insulation film 206 made of, for example, a silicon oxide film, is formed over the first semiconductor substrate 201 and the second semiconductor substrate 203 including interior wall surfaces of the via holes BH and bh and interior wall surfaces of the trenches TR and the recesses C.

Figure 2I:
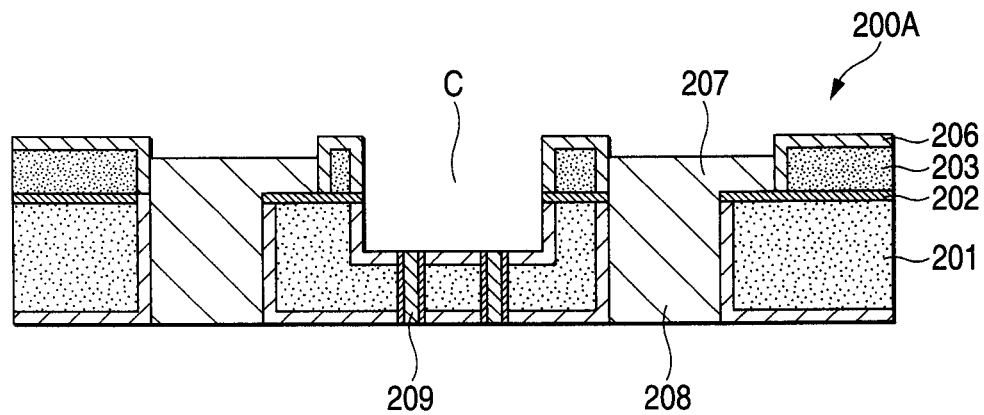
FIG. 2I is a view showing the method for manufacturing an electronic component of the second exemplary embodiment (part 9)

Next, in a step shown in FIG. 2I, via plugs 208 filling the via holes BH and pattern wiring 207 filling the trenches TR are formed integrally by means of plating of; e.g., Cu. The via plugs 208 and the pattern wiring 207 are formed as follows. First, a seed layer (a feeding layer) is formed on the insulation film 206 by means of electroless plating, and a mask pattern is formed on the seed layer. Subsequently, the via plugs 208 and the pattern wiring 207 are formed by means of electrolytic plating. Further, the mask pattern and excessive areas of the seed layer which are uncovered as a result of removal of the mask pattern are removed. Moreover, via plugs (via plugs for mounting an element) 209 filling the via holes bh are formed concurrently with formation of the via plugs 208 and the pattern wiring 207. Thus, an electronic component (a wiring substrate) 200A shown in FIG. 2I can be fabricated.

The electronic device 200A has the via plugs 208 which are made of Cu and penetrate through the first semiconductor substrate 201; and the pattern wiring 207 which is made of Cu and penetrates through the second semiconductor substrate 203, wherein at least a portion of the pattern wiring 207 substantially reaches the connection layer 202. Further, the electronic device 200A is characterized by having the recess C—which is formed in the first semiconductor substrate and the second semiconductor substrate 203 and is used for mounting an electronic element—and a via plug (a via plug used for mounting an element) 209 used for connection of an electronic element.

In addition to yielding the same advantage as that yielded in the first exemplary embodiment, the method for manufacturing an electronic element is characterized in that the recess C used for mounting an electronic element (a semiconductor element) is formed. Therefore, it is possible to readily mount an electronic element and furthermore seal an electronic element into the recess C.

In a step subsequent to the step shown in FIG. 2I, steps as described below may also be performed, to thus form a structure appropriate for mounting an electronic element (e.g., a semiconductor element) or form an electronic component mounted with the electronic element.

Figure 2J:
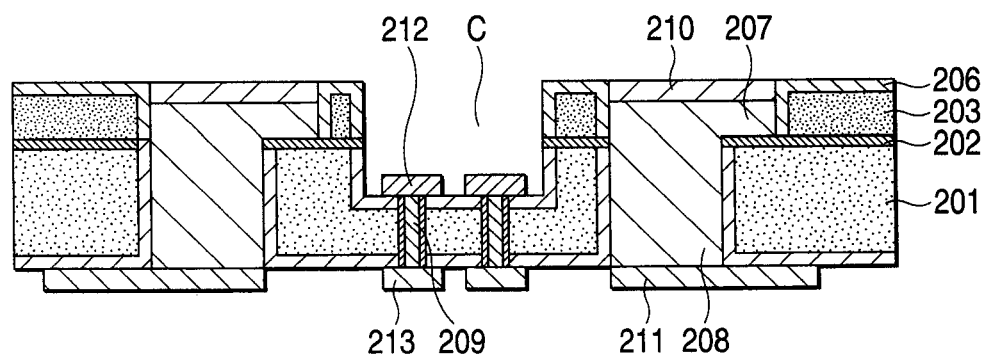
FIG. 2J is a view showing the method for manufacturing an electronic component of the second exemplary embodiment (part 10)

For instance, in a step shown in FIG. 2J, metal layers 210 and 211 made of Ni/Au (a multilayer structure including an Au layer and an Ni layer, wherein the Au layer is formed on an exterior side) are formed on the pattern wiring 207 and the via plugs 208. In this case, the metal layer 210 formed on the pattern wiring 207 is preferably formed so as not to run over the trenches; for instance, in such a way that the surface of the metal layer 210 becomes flush with the surface of the second semiconductor substrate 203.

In the same manner as mentioned above, a metal layer 212 is formed on an exposed side of the via plug 209 in the recess C, and a metal layer 213 is formed on an exposed side of the via plug 209 opposite to the exposed side in the recess C.

Figure 2K:
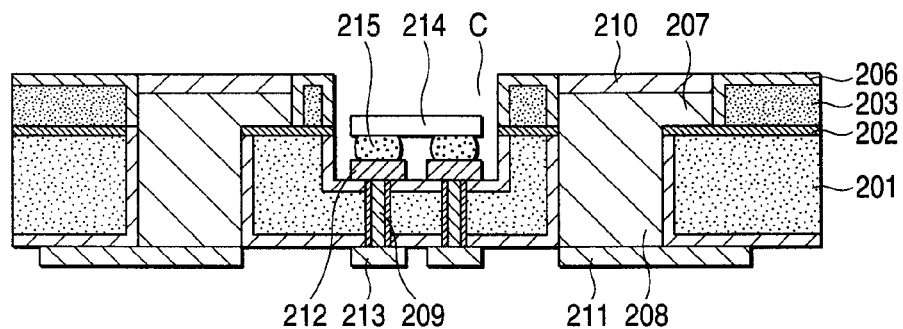
FIG. 2K is a view showing the method for manufacturing an electronic component of the second exemplary embodiment (part 11)

In a step shown in FIG. 2K, an electronic element (e.g., a semiconductor element) 214 is connected to the via plugs 209 through a metal layer 212 using the bumps 215. Thus, the electronic component shown in FIG. 2K—in which the electronic element (the semiconductor element) 214 is mounted on the electronic component (the wiring substrate) 100A—can be manufactured.

Figure 2L:
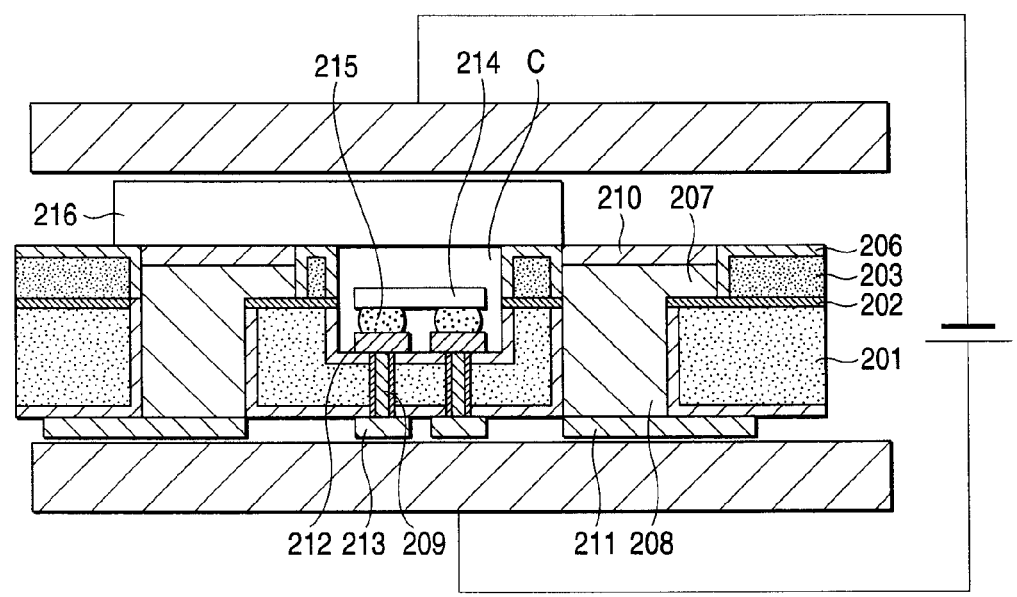
FIG. 2L is a view showing the method for manufacturing an electronic component of the second exemplary embodiment (part 12)

In a step shown in FIG. 2L, the electronic element 214 may also be sealed in the recess C. For instance, in a step shown in FIG. 2L, a flat cover 216 is bonded to the second semiconductor substrate 203 by means of anodic bonding, thereby sealing the electronic element 214 in the recess C.

For instance, when the electronic element 214 is an MEMS (Micro Electro Mechanical Systems) element, the electronic element 214 is preferably used while being sealed (enclosed) in a predetermined space. Even when the electronic element 214 is an optical-functional element, such as a light-emitting element or a light-receiving element, the electronic element 214 is preferably used while being sealed in a predetermined space as in the case of the MEMS element. According to the method for manufacturing an electronic element of the present embodiment, such an element can be sealed readily.

For example, in a case where the cover 216 is subjected to anodic bonding so as to contact the insulation film 206 made of a silicon oxide film, the cover 216 may be preferably made of silicon. Further, in a case where the electronic element is an optical-functional element (a light-emitting element or a light-receiving element), the cover 216 may be preferably made of an optically-transparent material. For example, in a case where glass is used as a material constituting the cover 216, the insulation film 206 may be preferably removed from predetermined areas before anodic bonding, and the cover (glass) 216 and the semiconductor substrate 203 (silicon) may be preferably configured to come into direct contact with each other.

Figure 2M:
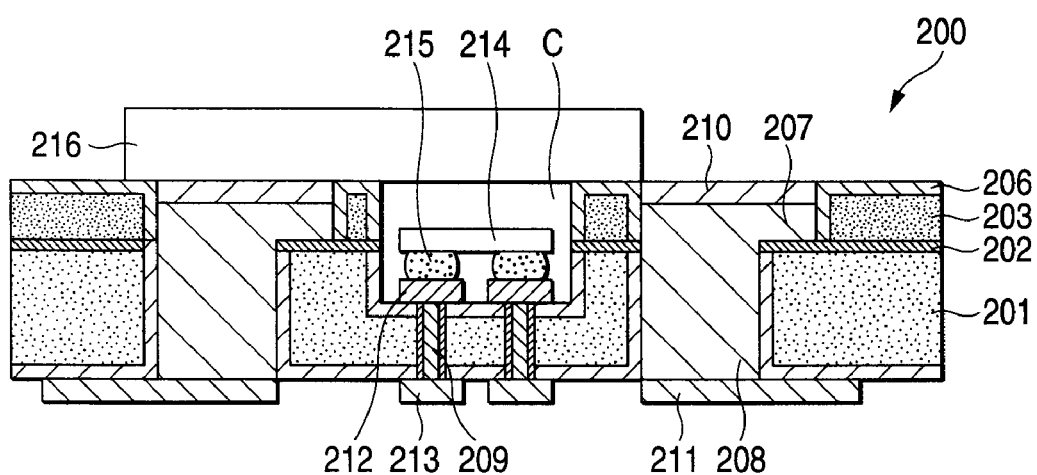
FIG. 2M is a view showing the method for manufacturing an electronic component of the second exemplary embodiment (part 13).

Through the above steps, an electronic component 200—which is shown in FIG. 2M and in which the electronic element (a semiconductor element) 214 is sealed in the recess C of the electronic component (wiring substrate) 200A—can be manufactured.

In the method for manufacturing the electronic component, an example of portions of specific areas of the first semiconductor substrate 201 and the second semiconductor substrate 203 is described. In usual, a plurality of areas as shown in FIGS. 2A to 2H are formed in a grid pattern in the first semiconductor substrate 201 and the second semiconductor substrate 203. In any of the steps shown in FIGS. 2I to 2M, the first semiconductor substrate 201 and the second semiconductor substrate 203 are sliced by means of dicing, to thus be separated into pieces.

According to the exemplary embodiments, the number of electronic elements mounted on the wiring substrate is not limited to one, and a plurality of electronic elements may also be mounted. Also, the number of recesses (cavities) formed for one electronic element is not limited to one, and a plurality of recesses may also be formed for one electronic component.

According to the exemplary embodiments, the semiconductor substrate used in the manufacturing method (for an electronic component) is not limited to a silicon substrate, and another semiconductor substrate (e.g., SiGe) may also be used.

According to the exemplary embodiments, it is possible to provide a thinned and highly-reliable electronic component which is formed from a semiconductor substrate.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. An electronic component comprising:
   a first semiconductor substrate;
   a second semiconductor substrate bonded to the first semiconductor substrate, the second semiconductor substrate having a trench defined therethrough;
   a connection layer provided between the first semiconductor substrate and the second semiconductor substrate;
   first via plugs penetrating through the first semiconductor substrate and communicating with the trench; and
   pattern wirings which penetrate through the second semiconductor substrate and are formed integrally with the via plugs and within the trench, at least a portion of the pattern wirings overlapping and directly contacting the connection layer in a direction transverse to a depth of the first via plugs, said pattern wirings having a surface opposed to the connection layer which is exposed through the second semiconductor substrate.

2. The electronic component according to claim 1, further comprising: an electronic element connected to the pattern wiring.

3. The electronic component according to claim 1, further comprising:
   a recess which is formed in the first semiconductor substrate and the second semiconductor substrate and in which the electronic element is mounted; and
   second via plugs which penetrate through bottom of the recess and is connected to the electronic element.

4. The electronic component according to claim 3, further comprising:
   an electronic element connected to the second via plugs.

5. The electronic component according to claim 4, further comprising:
   a flat cover which seals the electronic element in the recess.

6. The electronic component according to claim 1, wherein when viewed from a depth direction of the first via plugs, a width of each of the first via plugs is different from that of each of the pattern wirings.

7. The electronic component according to claim 1, wherein the connection layer is an etch-stop layer which is used for pattern-etching the second semiconductor layer.

8. The electronic component according to claim 1, further comprising pattern wiring metal layers formed on the surface of the pattern wirings exposed through the second semiconductor substrate, said pattern wiring metal layers cooperating with an insulating layer formed on a surface of the second semiconductor substrate opposed to a surface adjacent to the connection layer to form a flush outer surface.

9. The electronic component according to claim 8, wherein a second insulating layer is formed on the flush outer surface, and second pattern wirings overlaying the pattern wirings formed within the trench of the second semiconductor substrate are formed on the second insulating layer, said second pattern wirings being connected to the pattern wiring metal layers through second via plugs which penetrate the second insulating layer.

10. The electronic component according to claim 9, further comprising a conductive bump formed directly on the second pattern wirings and connecting the second pattern wirings to an electronic element.

11. The electronic component according to claim 1, wherein the first via plugs include a surface exposed through the first semiconductor substrate which cooperates with an insulating layer formed on a surface of the first semiconductor substrate opposed to a surface adjacent to the connection layer to form a flush outer surface.

12. The electronic component according to claim 11, wherein via plug metal layers are formed directly on the surface of the first via plugs exposed through the first semiconductor surface.

13. The electronic component according to claim 1, wherein the trench is defined by a first internal side edge of the second semiconductor substrate and a second internal side edge of the second semiconductor substrate, said second internal side edge being opposed to said first internal side edge, and the pattern wirings are defined by a first end which abuts the first internal side edge of the second semiconductor substrate and a second end which abuts the second internal side edge of the second semiconductor substrate, and the surface of the pattern wirings which is exposed through the second semiconductor substrate extends between the first and second ends of the pattern wiring.

* * * * *